(12) United States Patent
Watanabe et al.

(10) Patent No.: US 9,983,375 B2
(45) Date of Patent: May 29, 2018

(54) SURFACE LIGHT EMITTING SEMICONDUCTOR LASER ELEMENT

(71) Applicant: Sony Corporation, Tokyo (JP)

(72) Inventors: Yoshiaki Watanabe, Kanagawa (JP); Hironobu Narui, Kanagawa (JP); Yuichi Kuromizu, Kanagawa (JP); Yoshinori Yamauchi, Kanagawa (JP); Yoshiyuki Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days. days.

(21) Appl. No.: 14/725,092

(22) Filed: May 29, 2015

(65) Prior Publication Data

US 2015/0293319 A1    Oct. 15, 2015

Related U.S. Application Data

(63) Continuation of application No. 12/728,982, filed on Mar. 22, 2010, now abandoned, which is a
(Continued)

(30) Foreign Application Priority Data

May 19, 2003    (JP) .................................. 2003-140181

(51) Int. Cl.
*H01S 5/00*    (2006.01)
*G02B 6/42*    (2006.01)
(Continued)

(52) U.S. Cl.
CPC ........ *G02B 6/4296* (2013.01); *H01S 5/02284* (2013.01); *H01S 5/02288* (2013.01);
(Continued)

(58) Field of Classification Search
CPC ............. H01S 5/18311; H01S 5/18388; H01S 5/18394; H01S 5/32308; H01S 5/02284;
(Continued)

(56) References Cited

U.S. PATENT DOCUMENTS 4,780,748 A    10/1988    Cunningham et al.
4,922,320 A    5/1990    McDavid et al.
(Continued)

FOREIGN PATENT DOCUMENTS

EP    1130720 A1    9/2001
EP    1480303 A2 *  11/2004   .......... H01S 5/18311
(Continued)

OTHER PUBLICATIONS

Machine English Translation of JP-2004-342970.*
(Continued)

*Primary Examiner* — Hrayr A Sayadian
(74) *Attorney, Agent, or Firm* — Michael Best & Friedrich LLP

(57) ABSTRACT

A surface light emitting semiconductor laser element, comprises a substrate, a lower reflector including a semiconductor multi-layer disposed on the substrate, an active layer disposed on the lower reflector, an upper reflector including a semiconductor multi-layer disposed on the active layer, a compound semiconductor layer having a first opening for exposing the upper reflector and extending over the upper reflector, and a metal film having a second opening for exposing the upper reflector disposed inside of the first opening and extending over the compound semiconductor layer, wherein the metal film and the compound semiconductor layer constitute a complex refractive index distribution structure where a complex refractive index is changed
(Continued)

from the center of the second opening towards the outside. A method of emitting laser light in a single-peak transverse mode is also provided.

28 Claims, 14 Drawing Sheets

Related U.S. Application Data continuation of application No. 10/847,904, filed on May 18, 2004, now Pat. No. 7,684,453.

(51) Int. Cl.
| | |
|---|---|
| *H01S 5/183* | (2006.01) |
| *H01S 5/022* | (2006.01) |
| *H01S 5/042* | (2006.01) |
| *H01S 5/22* | (2006.01) |
| *H01S 5/323* | (2006.01) |

(52) U.S. Cl.
CPC ........ *H01S 5/0425* (2013.01); *H01S 5/18311* (2013.01); *H01S 5/18388* (2013.01); *H01S 5/18394* (2013.01); *H01S 5/2214* (2013.01); *H01S 5/32308* (2013.01); *H01S 2301/18* (2013.01); *H01S 2301/203* (2013.01)

(58) Field of Classification Search
CPC .. H01S 5/2214; H01S 5/0425; H01S 5/02288; H01S 2301/18; H01S 2301/203; G02B 6/4296
USPC .......................................................... 385/33
See application file for complete search history.

(56) References Cited

U.S. PATENT DOCUMENTS

| | | | |
|---|---|---|---|
| 5,239,189 A | | 8/1993 | Lawrence |
| 5,594,751 A | | 1/1997 | Scott |
| 5,821,569 A | | 10/1998 | Dutta |
| 5,861,636 A | | 1/1999 | Dutta et al. |
| 5,892,784 A | * | 4/1999 | Tan ..................... H01L 33/0016 257/E33.047 |
| 6,320,893 B1 | | 11/2001 | Ueki |
| 6,410,947 B1 | | 6/2002 | Wada |
| 6,480,516 B1 | * | 11/2002 | Shimizu .............. H01S 5/18305 359/344 |
| 6,529,541 B1 | | 3/2003 | Ueki et al. |
| 6,664,639 B2 | | 12/2003 | Cleeves |
| 6,885,690 B2 | * | 4/2005 | Aggerstam ......... H01S 5/18338 372/96 |
| 6,898,226 B2 | | 5/2005 | Otoma et al. |
| 7,020,173 B2 | | 3/2006 | Yamamoto et al. |
| 7,126,977 B2 | * | 10/2006 | Kaneko ................. B82Y 20/00 372/99 |
| 7,684,453 B2 | | 3/2010 | Watanabe et al. |
| 2001/0021208 A1 | | 9/2001 | Ueyanagi |
| 2002/0181536 A1 | * | 12/2002 | Jeon ..................... H01S 5/18388 372/96 |
| 2003/0026308 A1 | | 2/2003 | Iwai et al. |
| 2003/0218191 A1 | | 11/2003 | Nordal et al. |
| 2004/0066820 A1 | * | 4/2004 | Johnson ............... H01S 5/18391 372/45.01 |
| 2004/0184500 A1 | * | 9/2004 | Kuwata ............... H01S 5/02296 372/46.01 |
| 2004/0228380 A1 | | 11/2004 | Kuromizu et al. |
| 2005/0013334 A1 | * | 1/2005 | Watanabe ........... H01S 5/18311 372/44.01 |
| 2010/0177799 A1 | * | 7/2010 | Watanabe ........... H01S 5/18311 372/45.01 |
| 2011/0116147 A1 | * | 5/2011 | Motomura ............... B41J 2/473 359/204.1 |

FOREIGN PATENT DOCUMENTS

| | | | |
|---|---|---|---|
| JP | 08-242037 A | | 9/1996 |
| JP | 09-074219 A | | 3/1997 |
| JP | 09-246660 | | 9/1997 |
| JP | 09-260763 A | | 10/1997 |
| JP | 10-056233 A | | 2/1998 |
| JP | 11-068225 A | | 3/1999 |
| JP | 2000-022271 A | | 1/2000 |
| JP | 2001-156395 A | | 6/2001 |
| JP | 2001-210908 A | | 8/2001 |
| JP | 2001-223433 A | | 8/2001 |
| JP | 2002-208755 A | | 7/2002 |
| JP | 2002-359432 A | | 12/2002 |
| JP | 2004-342970 A | | 12/2004 |
| JP | 2004342970 A | * | 12/2004 |
| KR | 20010046631 A | | 6/2001 |

OTHER PUBLICATIONS

English Abstract of JP-2004-342970.*
Abstract of OTOMA in English.
English Machine Translation of OTOMA.
Ueki et al. "Single-TRA Verse-Mode 3.4-MW Emission of Oxide-Confined 780-NM VCSEL'S", IEEE Photonics Technology Letters, vol. 11, No. 12, Dec. 1999, IEEE Service Center Piscatway, N.J, US, XP000924489, ISSN: 1041-1135.
U Merriam-Webster Online definition of island (Feb. 12, 2013).
Extended European Search Report dated Jul. 26, 2017 for corresponding European Patent Application No. 17171660.8.
Ueki et al. "Single-TRA Verse-Mode 3.4-MW Emission of Oxide-Confined 780-NM VCSEL'S", IEEE Photonics Technology Letters, vol. 11, No. 12, Dec. 1999, IEEE Service Center Piscataway, N.J, US, XP000924489, ISSN: 1041-1135.

* cited by examiner

AMENDED

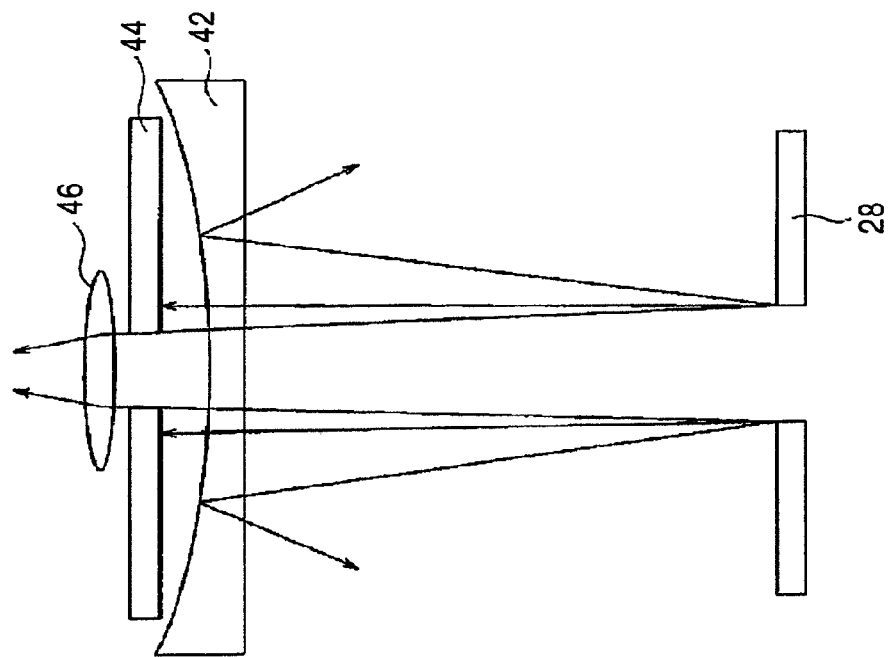
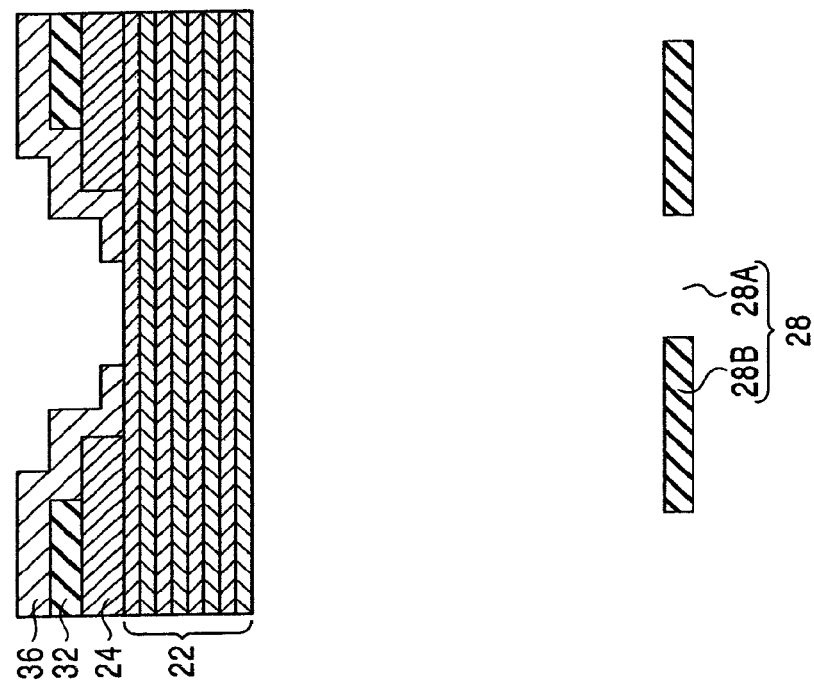

SURFACE LIGHT EMITTING SEMICONDUCTOR LASER ELEMENT

CROSS REFERENCE TO RELATED APPLICATIONS

This is a Continuation Application of U.S. application Ser. No. 12/728,982, filed Mar. 22, 2010, which is a Continuation Application of U.S. patent application Ser. No.: 10/847,904, filed May 18, 2004, now Pat. No.: 7,684,453, issued on Mar. 23, 2010, which claims priority to Japanese Patent Application No. 2003-140181, filed May 19, 2003, the entire contents of which are incorporated herein by reference.

BACKGROUND OF THE INVENTION

1. Field of the Invention

The present invention relates to a surface light emitting semiconductor laser element and a method of manufacture thereof. More particularly, the present invention relates to a surface light emitting semiconductor laser element and a method of emitting laser light in a single-peak transverse mode.

2. Description of the Related Art

A surface light emitting semiconductor laser element emits laser light in a direction orthogonal to a surface of a substrate, and is a remarkable light source for application in various fields.

The surface light emitting semiconductor laser element has a semiconductor substrate, a pair of upper and lower reflectors, i.e., Diffractive Bragg Reflectors (DBRs) comprising compound semiconductors having different refractive indices on the substrate, and an active layer that constitutes a light emitting area between the pair of reflectors.

Typically, the surface light emitting semiconductor laser element has a post-type mesa structure were the upper DBR has a current confinement area. For example, Japanese Unexamined Patent Application Publication No. 2001-210908 discloses a surface light emitting semiconductor laser element comprising a circular post-type mesa structure having a mesa diameter of about 30 µm obtained by dry etching the upper DBR, and a current confinement area within the circular post-type mesa structure formed by selectively oxidizing an AlAs layer to efficiently inject current into the active layer.

Referring to the above-mentioned Japanese patent application publication and FIG. 12, a conventional surface light emitting semiconductor laser element comprising a post-type mesa structure will be described. FIG. 12 is a sectional view showing the structure of the conventional surface light emitting semiconductor laser element disclosed in the above-mentioned patent application publication.

As shown in FIG. 12, a surface light emitting semiconductor laser element 80 has a laminated structure sequentially comprising an n-type GaAs substrate 82, a lower diffractive bragg reflector (hereinafter "lower DBR") 84 comprising an n-type semiconductor multi-layer, a lower clad layer 86 comprising non-doped AlGaAs, a light emitting layer (active layer) 88, an upper clad layer 90 comprising non-doped AlGaAs, an upper diffractive bragg reflector (hereinafter "upper DBR") 92 comprising non-doped AlGaAs, and a p-type GaAs cap layer 94.

The lower DBR 84 has a semiconductor multi-layer structure including 30.5 pairs of n-type $Al_{0.2}Ga_{0.8}As$ layers and n-type $Al_{0.9}Ga_{0.1}As$ layers having composition gradient layers on the hetero interfaces. The upper DBR 92 has a semiconductor multi-layer structure including 25 pairs of p-type $Al_{0.2}Ga_{0.8}As$ layers and p-type $Al_{0.9}Ga_{0.1}As$ layers having composition gradient layers on the hetero interfaces.

A cylindrical mesa post 96 is formed by etching the cap layer 94, the upper DBR 92, the upper clad layer 90, the active layer 88, the lower clad layer 86, and the lower DBR 84.

A p-type AlAs layer is formed instead of the p-type $Al_{0.9}Ga_{0.1}As$ layer on the compound semiconductor layer of the upper DBR 92 at the nearest side of the active layer 88. Al contained in the p-type AlAs layer is selectively oxidized excluding a center circular area to provide an oxidized-Al current confinement layer 98.

The p-type AlAs layer remaining on the center circular area functions as a current injection area 98A, and the oxidized-Al current confinement layer functions as an insulation area 98B having high electrical resistance.

A $SiN_x$ film 100 is formed over the mesa post 96 and the lower DBR 84. The $SiN_x$ film has an opening for exposing the p-type GaAs cap layer 94 provided by circularly removing the $SiN_x$ film 100 on the upper surface of the mesa post 96. A circular p-side electrode (upper electrode) 102 is formed at the periphery of the opening. On the opposite surface of the n-type GaAs substrate 82, an n-side electrode (lower electrode) 104 is formed. The p-side electrode 102 has an extraction electrode 106.

Referring to FIGS. 13A and 13B, a method of producing the surface light emitting semiconductor laser element 80 will now be described. FIG. 13A and 13B are sectional views showing steps of producing the surface light emitting semiconductor laser element 80.

As shown in FIG. 13A, the laminated structure is formed by sequentially laminating the lower DBR 84, the lower clad layer 86 comprising non-doped AlGaAs, the active layer 88, the upper clad layer 90 comprising non-doped AlGaAs, the upper DBR 92, and the p-type GaAs cap layer 94 on the n-type GaAs substrate 82.

The lower DBR 84 is produced by laminating 30.5 pairs of the n-type $Al_{0.2}Ga_{0.8}As$ layers and the n-type $Al_{0.9}Ga_{0.1}As$ layers having the composition gradient layers on the hetero interfaces. The upper DBR 92 is produced by laminating 25 pairs of the p-type $Al_{0.2}Ga_{0.8}As$ layers and the p-type $Al_{0.9}Ga_{0.1}As$ layers having the composition gradient layers on the hetero interfaces.

Before the upper DBR 92 is formed, the p-type AlAs layer 108 is formed instead of the p-type $Al_{0.9}Ga_{0.1}As$ layer on the compound semiconductor layer of the upper DBR 92 at the nearest side of, or adjacent to the active layer 88.

As shown in FIG. 13B, the p-type GaAs cap layer 94, the upper DBR 92, the AlAs layer 108, the upper clad layer 90, the active layer 88, and the lower clad layer 86 are partially etched using a $SiN_x$ film mask 110 until the upper surface of the lower DBR 84 is exposed, whereby a mesa post 96 is formed.

The laminated structure having the mesa post 96 is heated at 400° C. for about 25 minutes under steam atmosphere to selectively oxidize only the p-type AlAs layer from the side face to the center of the mesa post 96.

Thus, a current confinement layer 98 is formed. The current confinement layer 98 has the cylindrical current confinement area 98B comprising the oxidized-Al layer, and the circular current injection area 98A comprising the p-type AlAs layer 108 that is not oxidized and remains. The circular current injection area 98A is surrounded by the current confinement area 98B.

After the $SiN_x$ film 100 is formed over the entire surface, the $SiN_x$ film 100 on the upper surface of the mesa post 96 is circularly removed to expose the p-type GaAs cap layer 94 where the circular p-side electrode is formed. At the opposite surface of the n-type GaAs substrate 82, the n-side electrode 104 is formed. As a result, the conventional surface light emitting semiconductor laser element 80 is provided.

In the surface light emitting semiconductor laser element comprising the post-type mesa structure, the current confinement layer 98 defines a section of a path for injecting a current into the active layer 88. Therefore, the current is intensively injected into the active layer 88 around the current confinement area 98B, which leads to efficient laser oscillation.

Typically, the conventional surface light emitting semiconductor laser element oscillates in a multi-mode which is a transverse mode having a plurality of peaks in the far field pattern (FFP).

When the surface light emitting semiconductor laser element is lens-coupled to an optical waveguide such as an optical fiber in the communication field, the surface light emitting semiconductor laser element desirably emits beams in a single-peak transverse mode, i.e., a Gaussian distribution mode, in order to improve the optical connection efficiency.

In the oxidized-type current confinement structure, the number of modes in the oscillating laser light is substantially in proportion to the size of the current confinement layer. Therefore, when the current injection area in the current confinement layer is decreased, it is possible to emit light in a single mode excited in a narrow area of the active layer.

Accordingly, in the conventional surface light emitting semiconductor laser element having the oxidized-type current confinement structure, when the size of the current confinement structure (current injection area) comprising the oxidized-Al layer is reduced, the light-emitting area of the active layer can be decreased and light is selectively oscillated in the single-peak transverse mode.

In order to provide the single-peak transverse mode, the size of the current confinement structure should be as small as 4 µm or less, as reported in IEEE. Photon, Tech. Lett. Vol. 9, No. 10, p. 1304, by M. Grabherr et al. However, if the size of the current confinement structure is 4 µm or less, the following problems occur.

Firstly, the tolerance of production errors becomes limited, since the size of the current confinement structure is extremely small. It is difficult to produce a surface light-emitting semiconductor laser element having a current confinement structure with a small diameter with good controllability. Also, wafer in-plane uniformity becomes poor, resulting in significantly decreased yields.

Secondly, current flows through the decreased current injection area (AlAs layer) by one order of magnitude as compared with the typical devices, whereby the resistance of the element becomes high, i.e., 100 Ω or more. As a result, the output as well as the current and light emission efficiencies are lowered. In other words, since the output depends on the single-peak transverse mode, it is difficult to provide high output from the surface light emitting semiconductor laser element in the single-peak transverse mode.

Thirdly, due to the increased resistance caused by the current confinement, the impedance is mismatched. If the surface light emitting semiconductor laser element is attempted to be driven at high frequency, the high frequency properties are significantly degraded. Accordingly, it is difficult to apply the surface light emitting semiconductor laser element to light transmission driven at high frequency, as required in the communication field.

For transverse mode control of the laser light in a surface light emitting semiconductor laser element, Japanese Unexamined Patent Application Publication No. 2002-359432 discloses, for example, a method of stabilizing the transverse mode by processing a light emitting surface. However, this publication is not directed to the stabilization of the single transverse mode, but to the stabilization of a higher-order transverse mode.

Japanese Unexamined Patent Application Publication N 2001-24277 discloses that a reflectance distribution is provided at a reflecting surface opposite to a light-emitting surface to stabilize the transverse mode. However, since light is injected through a substrate, it is difficult to apply this invention to a surface light emitting semiconductor laser element. In addition, since a proton-injection-type is presumed, it is difficult to apply this invention to the oxidized-type current confinement structure.

Japanese Unexamined Patent Application Publication No. 9-246660 discloses a method of stabilizing the transverse mode by disposing a lens structure comprising a circular diffraction grating within a laser. However, the process is complicated because a compound semiconductor layer should be re-grown. There are both technical and economical problems.

As described above, using the conventional technique, it is difficult to provide a surface light emitting semiconductor laser element that emits laser light in the single-peak transverse mode.

SUMMARY OF THE INVENTION

Accordingly, it is an object of the present invention to provide a surface light emitting semiconductor laser element that emits stable laser light in a single-peak transverse mode. It is another object of the present invention to provide a surface light emitting semiconductor laser element that emits stable laser light in a high-order mode, and a method of producing the same.

By repeating various research experiments, the present inventors discovered that the oscillating transverse mode of a surface light emitting semiconductor laser element is affected not only by the size of the current confinement structure, as described above, but also significantly by the optical structure of an upper surface on a mesa post that acts as a light-emitting surface. In other words, the transverse mode significantly depends on .a refractive index distribution and a shape of an electrode.

Various surface light emitting semiconductor laser elements having different upper surfaces or shapes of the mesa post have been trial manufactured to determine the relationship between the upper surface structure of the mesa post and the transverse mode. As a result, it was found that the transverse mode is greatly affected by the structure of an electrode on a contact layer as well as the shape, the refractive index, and the film thickness of a semiconductor layer, i.e., a contact layer, on the upper surface of the mesa post.

Through intensive studies, the present inventors discovered that a surface light emitting semiconductor laser element for emitting laser light in a single-peak transverse mode can be provided by a structure comprising a contact layer having a first opening for exposing an upper DBR and extending over the upper DBR, an electrode formed of a metal film having a second opening disposed inside of the first opening for exposing the upper DBR, and an insulation film between the contact layer and the electrode having a third opening disposed outside of the first opening for exposing the contact layer, as shown in FIG. 14A. In the surface light emitting semiconductor laser element, the impurity concentration in a current injection area is high, and uniformity of the current injection density at this area is improved.

In the structure on the upper DBR described above, a peripheral region of the second opening in the electrode, a peripheral region of the first opening in the contact layer, and a peripheral region of the third opening in the insulation film constitute a complex refractive index distribution structure where a complex refractive index is changed isotropically from the center of the second opening towards the outside. A single-peak transverse mode can be provided by the complex refractive index distribution structure.

In other words, the contact layer and the electrode constitute the complex refractive index distribution structure.

FIG. 14A is a schematic sectional view showing a main part of a surface light emitting semiconductor laser element according to one embodiment of the present invention. FIG. 14B is a schematic sectional view illustrating a function of the main part shown in FIG. 14A.

One aspect of the present invention is to provide a surface light emitting semiconductor laser element, comprising:
a substrate,
a lower reflector including a semiconductor multi-layer disposed on the substrate,
an active layer disposed on the lower reflector,
an upper reflector including a semiconductor multi-layer disposed on the active layer,
a compound semiconductor layer having a first opening for exposing the upper reflector and extending over the upper reflector, and
a metal film having a second opening for exposing the upper reflector disposed inside of the first opening and extended over the compound semiconductor layer,
wherein the metal film and the compound semiconductor layer constitute a complex refractive index distribution structure where a complex refractive index is changed from the center of the second opening towards the outside.

According to the surface light emitting semiconductor laser element, in the complex refractive index distribution structure, the complex refractive index is changed isotropically from the center of the second opening towards the. outside. The single-peak transverse mode can be more easily provided.

Another aspect of the present invention is to provide a surface light emitting semiconductor laser element, comprising:
a substrate,
a lower reflector including a semiconductor multi-layer disposed on the substrate,
an active layer disposed on the lower reflector,
an upper reflector including a semiconductor multi-layer disposed on the active layer,
a compound semiconductor layer having a first opening for exposing the upper reflector extended over the upper reflector, and
a metal film including an annular film and an island-like film, the annular film having a second opening for exposing the upper reflector being disposed inside of the first opening, the annular film extending over the compound semiconductor layer, and the island-like film being disposed like islands on the upper reflector within the second opening,
wherein the metal film and the compound semiconductor layer constitute a complex refractive index distribution structure where a complex refractive index is changed from the center of the second opening towards the outside.

In preferable embodiments of the above-mentioned aspects, the surface light emitting semiconductor laser element further comprises .a third opening disposed outside of the first opening for exposing the compound semiconductor layer, and an insulation film interposed between the compound semiconductor layer and the metal film, and the metal film, the compound semiconductor layer, and the insulation film constitute a complex refractive index distribution structure where a complex refractive index is changed from the center of the second opening towards the outside.

In specific embodiments of the above-mentioned aspects, the metal film constitutes an electrode, and the compound semiconductor layer constitutes a contact layer in ohmic contact with the metal film. A current injection area formed at a center of a current confinement layer is disposed under the first opening.

The surface light emitting semiconductor laser element according to one aspect of the present invention comprises an electric structure of three components: the compound semiconductor layer, i.e., the contact layer; the insulation layer; and the electrode, all of which are disposed on the light emitting surface of the upper DBR, as shown in FIG. 14A. The electric structure also provide optical functions.

The structure on the upper DBR will be described in relation to optical elements. As shown in FIG. 14B, the contact layer has the first opening, and the insulation layer has the third opening. The contact layer extending in a ring shape and the insulation layer extending in a ring shape on the contact layer are formed step-wise. The complex refractive index becomes great from the center of the first opening, i.e., the center of the light-emitting surface towards the outside, whereby the complex refractive index distribution structure acts as a concave lens.

The electrode made of the metal film is formed on the light-emitting surface, and has the second opening that is smaller than the first opening. The electrode has an aperture through which the light passes, whereby the complex refractive index distribution structure acts as a convex lens as well as an absorption opening, with the complex refractive index of the metal taken into consideration.

In other words, in the surface light emitting semiconductor laser element according to one aspect of the present invention, a combined optical system of the convex lens, the absorption opening and the concave lens is provided on the light-emitting surface. In addition, the combined optical system is disposed on a resonator of the surface light emitting semiconductor laser element and thus acts as one part of the resonator.

In the surface light emitting semiconductor laser element according to one aspect of the present invention, laser resonance modes are selected to some extent by the current confinement layer. Light in the high-order mode having a wide light-emitting angle is scattered at the concave lens, absorbed in the absorption opening and converged in the convex lens, as shown in FIG. 14B. The resonance conditions of the resonator are determined based on such mechanism. By combining the conditions with the effects of the aperture of the current confinement layer, almost one mode is forcedly selected, thereby oscillating at the single-peak transverse mode.

According to the spirit of one aspect of the present invention, the surface light emitting semiconductor laser element can be controlled in various transverse modes, i.e., the high-order mode.

According to another aspect of the present invention, the island-like metal film is disposed within the annular metal film, and the shape of the island-like metal film is changed based on the same spirit in one aspect of the present invention to adjust the complex refractive index distribution, whereby the surface light emitting semiconductor laser element can be controlled in various transverse modes, i.e., the high-order mode as desired.

The compound semiconductor layer having the first opening comprises a plurality of layers having different impurity concentrations, each of the first openings disposed on respective compound semiconductor layers has a diameter that becomes smaller step-wise from an upper layer to a lower layer of the plurality of compound semiconductor layers, and each of the impurity concentrations of respective compound semiconductor layers gradually decreases step-wise from the upper layer to the lower layer of the plurality of compound semiconductor layers.

Typically, the metal film constitutes an electrode, and the compound semiconductor layer constitutes a contact layer in ohmic contact with the metal film.

Preferably, the current confinement layer has a non-oxidized current injection area at the center, and the non-oxidized current injection area is disposed under the first opening, has an impurity concentration of $5 \times 10^{18}$ cm$^{-3}$, and has uniform current injection density. The above-mentioned combined optical system can be efficiently act as one part of the resonator.

A method of producing a surface light emitting semiconductor laser element of the present invention comprises the steps of:

sequentially laminating a lower reflector including a semiconductor multi-layer, an active layer, an upper reflector including a semiconductor multi-layer having a layer with a high Al content, and a contact layer on a substrate, etching the upper reflector having the layer with the high Al content to form a mesa post, forming an insulation film on the contact layer of the mesa post and a side of the mesa post, forming an opening on the insulation film over the contact layer to expose the contact layer, forming an opening on the contact layer smaller than the opening on the insulation film to expose the upper reflector, forming a metal film for constituting an electrode on the upper reflector and the contact layer, and forming an opening on the-metal film smaller than the opening on the contact film to expose the upper reflector.

In the step of forming the contact layer on the upper reflection layer, a plurality of contact layers are formed so that each of the impurity concentrations decreases step-wise or gradually from the upper layer to the lower layer.

In the step of forming the opening on the contact layer smaller than the opening on the insulation film to expose the upper reflector, the opening is formed on each contact layer so that each opening diameter decreases step-wise or gradually from the upper layer to the lower layer by utilizing a difference in etching rates by the fact that each of the impurity concentrations decreases step-wise or gradually from the upper layer to the lower layer. Thus, the complex refractive index distribution structure can be easily formed.

In the step of forming the contact layer on the upper reflection layer, a plurality of contact layers are formed so that each Al composition decreases step-wise or gradually from the upper layer to the lower layer.

In the step of forming the opening on the contact layer smaller than the opening on the insulation film to expose the upper reflector, the opening is formed on each contact layer so that each opening diameter decreases step-wise or gradually from the upper layer to the lower layer by utilizing a difference in etching rates by the fact that each Al composition decreases step-wise or gradually from the upper layer to the lower layer. Thus, the complex refractive index distribution structure can be easily formed.

According to one aspect of the present invention, a surface light emitting semiconductor laser element for emitting laser light in a single-peak transverse mode can be provided by forming a complex refractive index distribution structure composed of an annular metal film and the compound semiconductor layer on an upper reflector where a complex refractive index is changed from the center of an opening of the metal film, i.e., a center of a light emitting surface towards the outside.

When the surface light emitting semiconductor laser element according to one aspect of the present invention is used, a combined optical system connected to optical fibers and an optical waveguide can be significantly simplified. In addition, the surface light emitting semiconductor laser element of the present invention has a small light-emitting angle as compared with a conventional end face radiation type laser element, whereby the surface light emitting semiconductor laser element of the present invention can be connected to the optical fibers with high optical connection efficiency.

The surface light emitting semiconductor laser element for emitting laser light in a single-peak transverse mode of the present invention can be connected to quartz single mode fibers that is difficult for the conventional surface light emitting semiconductor laser element. For example, when the surface light emitting semiconductor laser element of the present invention is used in long wavelength bands such as infrared 1.3 µm band and 1.55 µm band, a long distance transmission, i.e., over tens kilometer, can be realized.

When the surface light emitting semiconductor laser element according to one aspect of the present is used in an optical wiring field where the combined optical system is hardly used in view of the costs, it is possible to provide a direct connection with high efficiency. Thus, the surface light emitting semiconductor laser element according to one aspect of the present can be used efficiently.

According to another aspect of the present invention, surface light emitting semiconductor laser element for emitting laser light in a desired high-order transverse mode can be provided by forming a complex refractive index distribution structure composed of an annular metal film, an island-like metal film, and an annular compound semiconductor layer on an upper reflector where a complex refractive index is changed from the center of an opening of the annular metal film, i.e., center of a light emitting surface towards the outside.

The surface light emitting semiconductor laser element according to the another aspect of the present invention can be advantageously applied to various fields including a medical, a machining, or a sensor fields that require various light emission patterns.

According to the present invention, there is also provided a preferable method of producing the surface light emitting semiconductor laser element of the present invention.

BRIEF DESCRIPTION OF THE DRAWINGS

FIG. 3A is a schematic sectional view showing a main part of the surface light emitting semiconductor laser element in according to a first embodiment of the present invention;

FIG. 3B is a schematic sectional view for illustrating functions of the main part corresponding to FIG. 3A;

DESCRIPTION OF THE PREFERRED EMBODIMENTS

The invention will be described in more detail which referring to the attached drawing. The conductivity type, the film type, the film thickness, the film forming method, the size and the like cited in the following embodiments are offered to aid in understanding of the present invention and are not to be construed as limiting the scope thereof.

Embodiment 1

Figure 1:
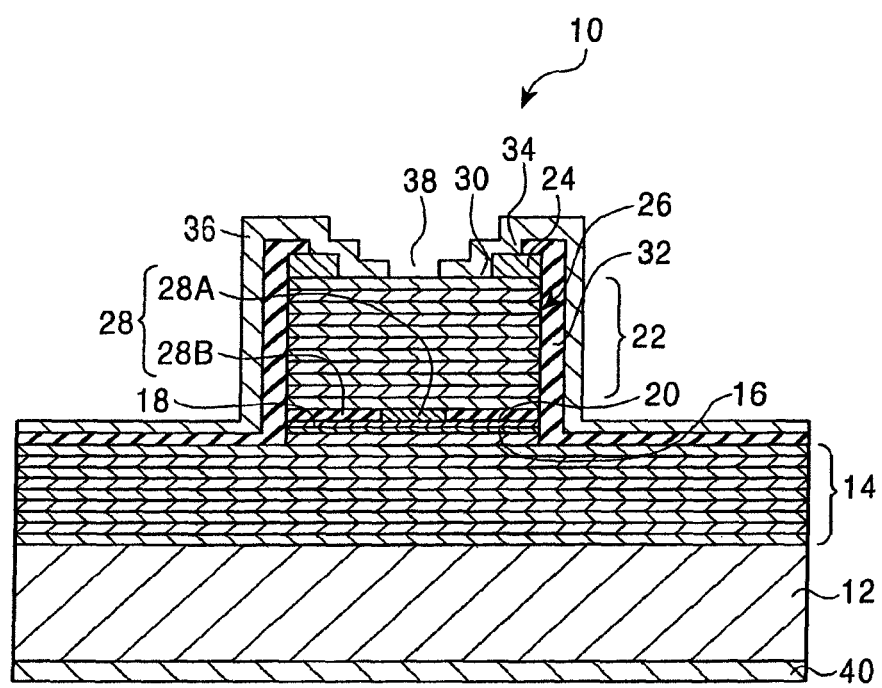
FIG. 1 is a sectional view showing the structure of a surface light emitting semiconductor laser element according to a first embodiment of the present invention.
Figure 2:
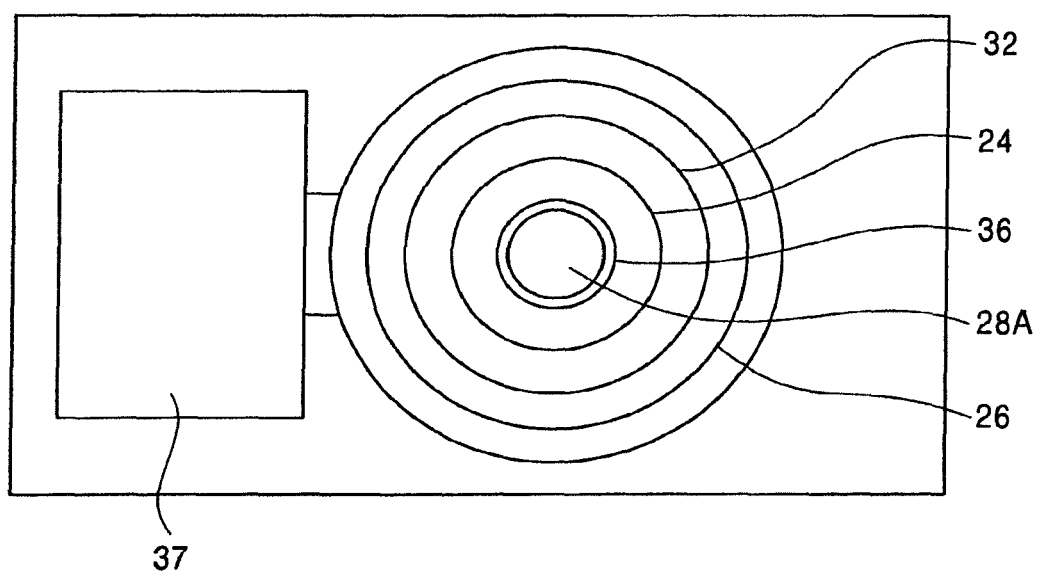
FIG. 2 is a top view of the surface light emitting semiconductor laser element in FIG. 1.

FIG. 1 shows a sectional view of a surface light emitting semiconductor laser element according to the present invention. FIG. 2 is a top view of the surface light emitting semiconductor laser element. FIG. 3A is a schematic sectional view showing a main part of the surface light emitting semiconductor laser element. FIG. 3B is a schematic sectional view for illustrating functions of the main part corresponding to FIG. 3A.

As shown in FIG. 1, a surface light emitting semiconductor laser element 10 comprises a laminated structure sequentially comprising an n-type GaAs substrate 12, a lower diffractive bragg reflector (hereinafter "lower DBR") 14 comprising an n-type semiconductor multi-layer, an $Al_{0.3}Ga_{0.7}As$ lower clad layer 16, a GaAs light emitting layer (active layer) 18, an $Al_{0.3}Ga_{0.7}As$ upper clad layer 20, an upper diffractive bragg reflector 22 (hereinafter "upper DBR") comprising a p-type GaAs cap layer, and a p-type GaAs contact layer 24 with a film thickness of 150 nm having an impurity concentration of $5 \times 10^{18}$ cm$^{-3}$.

The lower DBR 14 has a semiconductor multi-layer structure with a total film thickness of about 4 μm including 35 pairs of n-type AlAs layers and n-type GaAs layers. The upper DBR 22 has a semiconductor multi-layer structure with a total film thickness of about 3 μm including 25 pairs of p-type $Al_{0.9}Ga_{0.1}As$ layers and p-type $Al_{0.1}Ga_{0.9}As$ layers.

A cylindrical mesa post 26 having a mesa diameter of 40 μm is formed by etching the contact layer 24, the upper DBR 22, the upper clad layer 20, the active layer 18, the lower clad layer 16, and the lower DBR 14, as shown in FIGS. 1 and 2.

On the active layer 18 in the upper DBR 22, an oxidized current confinement layer 28 is disposed instead of the p-type $Al_{0.9}Ga_{0.1}As$ layer. The AlAs layer 28 has a film thickness of 30 nm, and comprises a circular AlAs layer 28A having a diameter of 12 μm disposed at the center and an oxidized-Al layer 28B disposed around the circular AlAs layer 28A.

The AlAs layer 28A is a p-type AlAs layer formed instead of the p-type $Al_{0.9}Ga_{0.1}As$ layer. The oxidized-Al layer 28B is formed by selectively oxidizing Al in the p-type AlAs layer. The oxidized-Al layer 28B has high electrical resistance and functions as a current confinement area, while the circular AlAs layer 28A functions as a current injection area having electrical resistance lower than that of the oxidized-Al layer 28B.

On the mesa post 26, the contact layer 24 has a first opening 30 having an inner diameter of 20 μm at the center. The contact layer 24 is annular to expose the upper DBR 22 through the first opening 30.

An insulation layer, i.e., a $SiO_2$ film 32 having a film thickness of 300 nm, is extended over the periphery of the contact layer 24, the side of the mesa post 26, and the lower DBR 14. The $SiO_2$ film 32 on the contact layer 24 has a circular third opening 34 having an inner diameter of 35 μm that is greater than the first opening 30 to expose the contact layer 24.

A p-side electrode 36 comprising a Ti/Pt/Au metal lamination film having a film thickness of 500 nm is extended over the upper DBR 22, the contact layer 24, and the $SiO_2$ film 32, and has a circular second opening 38 having an inner diameter of 14 μm on the upper DBR 22 to expose the upper DBR 22.

As shown in FIG. 2, the AlAs layer (current injection area) 28A has slightly smaller diameter than the third opening 38 of the p-side electrode 36. The AlAs layer 28A has a diameter of 12 μm, and the p-side electrode has an inner diameter of 14 μm.

At an opposite surface of the n-type GaAs substrate 12, an n-side electrode 40 comprising AuGe/Ni/Au is formed.

FIG. 3 schematically shows optical elements of the upper DBR 22. In the surface light emitting semiconductor laser element 10, the contact layer 24, the SiO$_2$ film 32, and the p-side electrode 36 on the upper DBR 22 provide both electrical and optical functions.

As shown in FIG. 3A, the contact layer 24 having the first opening 30 extended in a ring shape and the SiO$_2$ film 32 having the third opening 34 extended in a ring shape on the contact layer 24 are formed step-wise. Accordingly, the complex refractive index is increased isotropically from the center of the first opening 30, i.e., the center of a light emitting surface, towards the outside. As shown in FIG. 3B, there is provided a complex refractive index distribution structure that acts as a convex lens.

The p-side electrode 36 having the second opening 38 has an aperture through which the light passes. As shown in FIG. 3B, the p-side electrode 36 provides optical functions. similar to the complex refractive index distribution structure having an absorption opening 44 and a convex lens 46, since the metal in the p-side electrode 36 provides the complex refractive index.

For example, gold (Au) has a real-part refractive index of 0.2 and an imaginary-part (absorption coefficient) refractive index of 5.6 for a laser light with a wavelength of 0.85 μm.

In the surface light emitting semiconductor laser element 10, the contact layer 24 having the first opening 30 has a refractive index greater than that of the opening. The p-side electrode 36 having the second opening 38 has an absorption coefficient greater than that of the opening.

A combined optical system of the convex lens 46, the absorption opening 44, and the concave lens 42 is provided on the light-emitting surface. In addition, the combined optical system is disposed on a resonator of the surface light emitting semiconductor laser element 10 and thus acts as one part of the resonator.

In the surface light emitting semiconductor laser element 10, laser resonance modes are selected to some degree by the current confinement action of the current confinement layer 28. Light in the high-order mode having a wide light-emitting angle is scattered at the concave lens 42, absorbed in the absorption opening 44, and converged in the convex lens 46, as shown in FIG. 3B.

By combining these conditions with the effects of the aperture of the current confinement layer 28, almost one mode is forcedly selected, thereby oscillating in a single-peak transverse mode.

When the optical output is increased, almost one mode is forcedly selected by the convex lens 46, the absorption opening 44, and the concave lens 42, as well as by the aperture of the current confinement layer 28, whereby multiple transverse modes become a single-peak transverse mode, even if light is oscillated in the multiple transverse modes.

Figure 4:
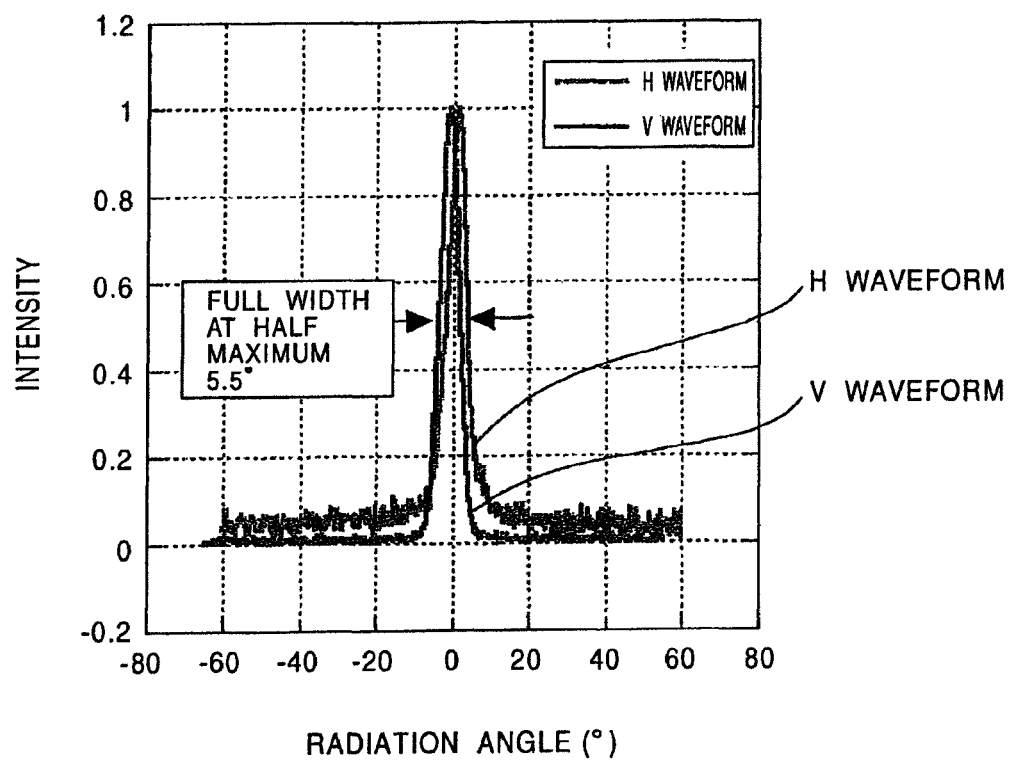
FIG. 4 is a graph showing a far-field pattern (FFP) of a surface light emitting semiconductor laser element in according to a first embodiment of the present invention.

The full width at half maximum (FWHM) of the surface light emitting semiconductor laser element 10 produced using the method described below was measured. As shown in FIG. 4, the FWHM is 5.5°, which is half or less that of the conventional surface light emitting semiconductor laser element having a constriction diameter of about 4 μm. Thus, the surface light emitting semiconductor laser element 10 is in a single-peak transverse mode. FIG. 4 is a graph showing a far-field pattern (FFP) of the surface light emitting semiconductor laser element 10. In the graph, H and V waveforms are intensity distributions of irradiated beams in planes orthogonal to each other.

In EMBODIMENT 1, the contact layer 24, the SiO$_2$ film 32 and the p-side electrode 36 are formed step-wise, whereby a complex refractive index changing from the center of the second opening 38, i.e., the center of a light emitting surface, towards the outside is formed to provide a single-peak transverse mode.

The surface light emitting semiconductor laser element 10 can provide almost the same level of optical output as that provided by a conventional multi-mode surface light emitting semiconductor laser element. Since the surface light emitting semiconductor laser element 10 has the same electrical structure as that of the conventional multi-mode surface light emitting semiconductor laser element, the surface light emitting semiconductor laser element 10 has almost the same level of resistance and impedance.

The surface light emitting semiconductor laser element 10 emits laser light in a single-peak transverse mode so that the surface light emitting semiconductor laser element 10 can be optically coupled to actual optical fibers with high optical-connection efficiency.

Embodiment 2

FIGS. 5A, 5B, 6C, 6D, 7E and 7F are sectional views showing steps of manufacturing the surface light emitting semiconductor laser element according to the present invention.

Figure 5A:
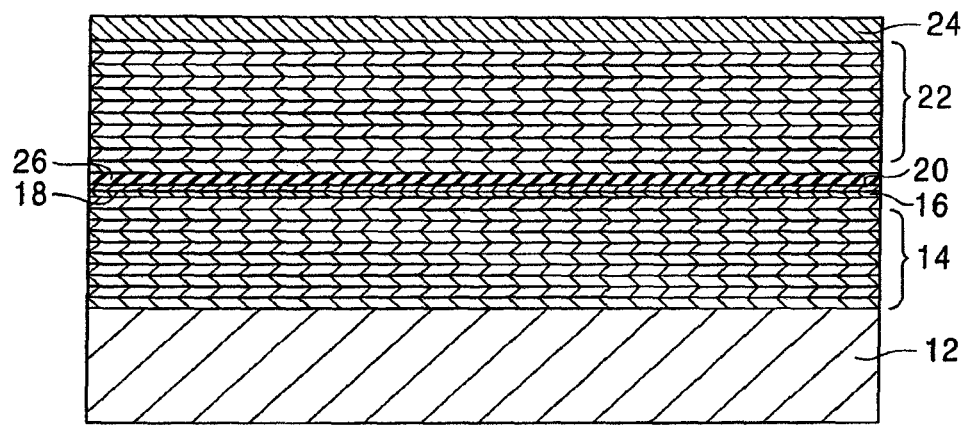
FIG. 5A is a sectional view showing a step of manufacturing a surface light emitting semiconductor laser element in according to a second embodiment of the present invention.

As shown in FIG. 5A, a lower DBR 14, a lower clad layer 16, a light emitting layer (active layer) 18, an upper clad layer 20, an upper DBR 22, and a p-type GaAs contact layer 24 are sequentially laminated on an n-type GaAs substrate 12 using a MOCVD method or the like.

Before the upper DBR 22 is formed, an AlAs layer 28 having a film thickness of 30 nm is formed instead of the p-type Al$_{0.9}$Ga$_{0.1}$As layer on the layer of the upper DBR 22 at the nearest side of the active layer 18.

Figure 5B:
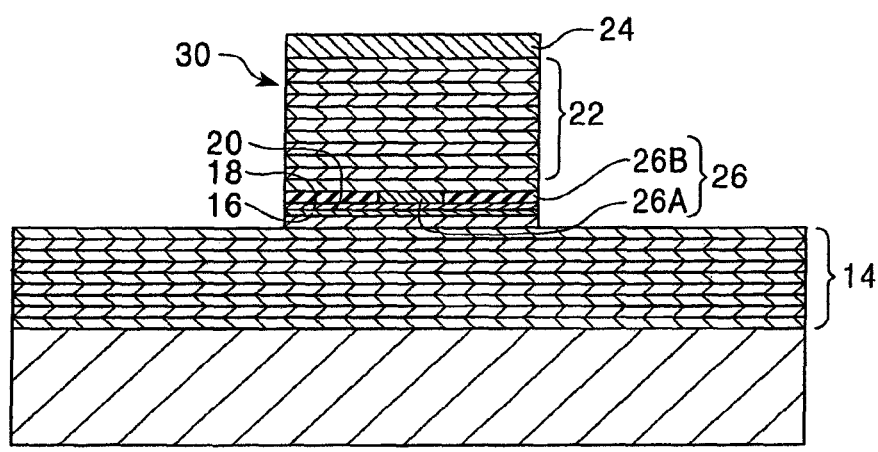
FIG. 5B is a sectional view showing a step of manufacturing the surface light emitting semiconductor laser element in according to a second embodiment of the present invention.

As shown in FIG. 5B, the contact layer 24, the upper DBR 22, the upper clad layer 20, the active layer 18, the lower clad layer 16, and the lower DBR 14 are etched by a dry etching method using a chlorine-based gas to form a cylindrical mesa post 26 having a mesa diameter of 40 μm.

The laminated structure having the mesa post 26 is heated at 400° C. under steam atmosphere to selectively oxidize only Al in the AlAs layer 28 from the peripheral to the internal side of the mesa post 26, leaving a circular AlAs layer 28A having a diameter of 12 μm at the center, and disposing an oxidized-Al layer 26B around the AlAs layer 28A. Thus, a current confinement layer is formed.

Figure 6C:
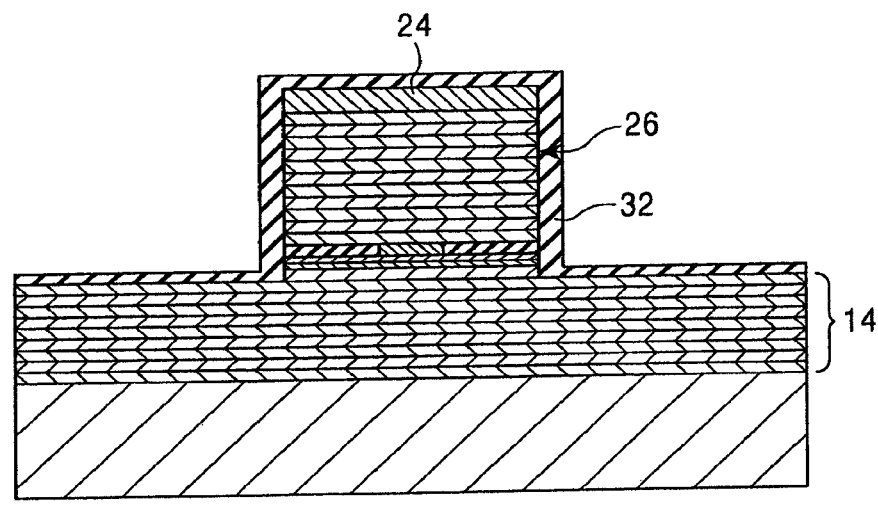
FIG. 6C is a sectional view showing a step of manufacturing the surface light emitting semiconductor laser element in according to a second embodiment of the present invention.

As shown in FIG. 6C, a SiO$_2$ film 32 is formed over the contact layer 24 of the mesa post 26, the side of the mesa post 26, and the lower DBR 14.

Figure 6D:
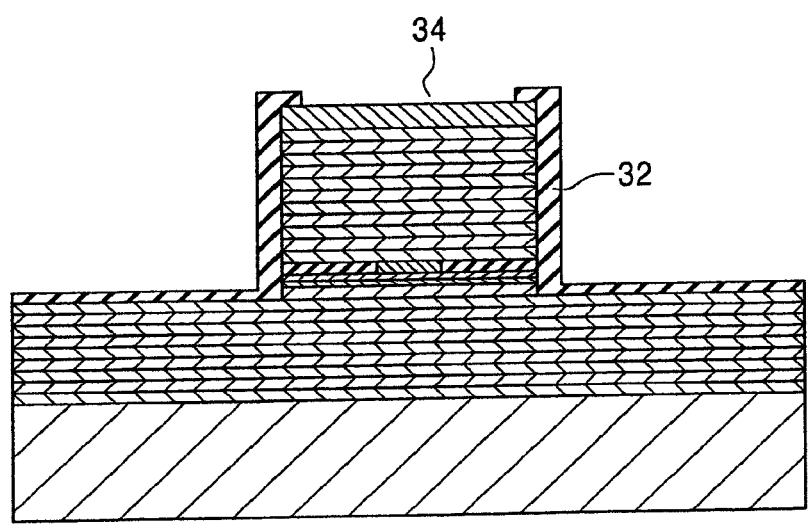
FIG. 6D is a sectional view showing a step of manufacturing the surface light emitting semiconductor laser element in according to a second embodiment of the present invention.

As shown in FIG. 6D, the SiO$_2$ film 32 is etched to provide an opening 34 having an inner diameter of 35 μm.

Figure 7E:
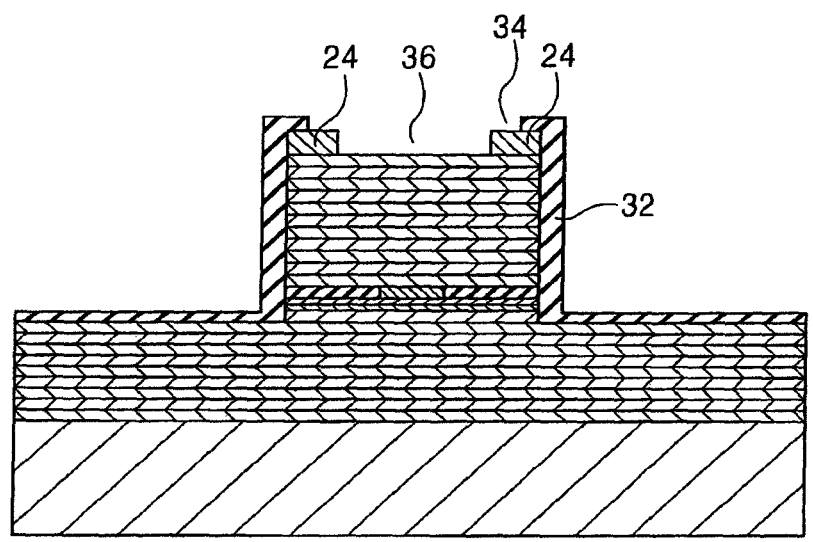
FIG. 7E is a sectional view showing a step of manufacturing the surface light emitting semiconductor laser element in according to a second embodiment of the present invention.

As shown in FIG. 7E, the contact layer 24 exposed on the opening 34 is etched to provide an opening 34 having an inner diameter of 20 μm.

Figure 7F:
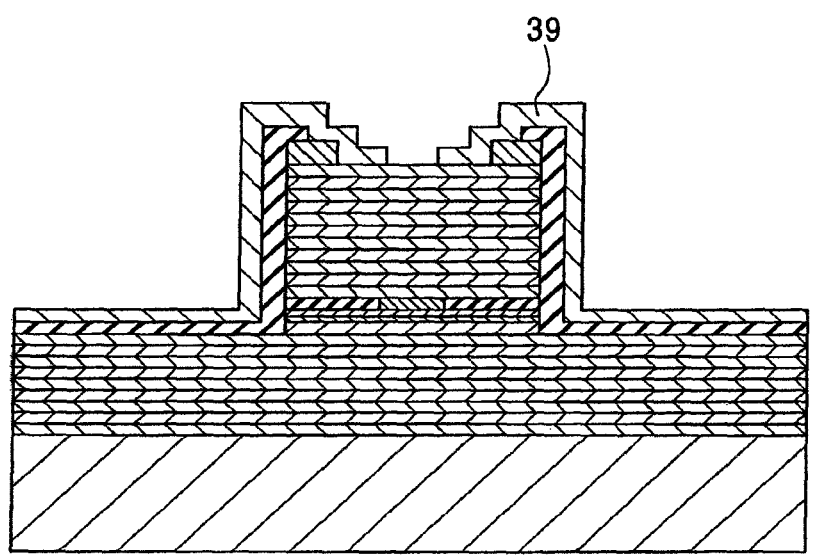
FIG. 7F is a sectional view showing a step of manufacturing the surface light emitting semiconductor laser element in according to a second embodiment of the present invention.

As shown in FIG. 7F, a Ti/Pt/Au metal lamination film 39 is formed on the mesa post 26.

Furthermore, the metal lamination film 39 is etched to provide an opening 38, whereby a p-side electrode 36 is formed. After the n-type GaAs substrate 12 is polished to a predetermined thickness, an n-side electrode 40 is formed on the opposite surface of the n-type GaAs substrate 12. Thus, the surface light emitting semiconductor laser element 10 shown in FIG. 1 can be produced.

As described above, the surface light emitting semiconductor laser element 10 can be produced with similar processes to those used for the conventional surface light emitting semiconductor laser element except for the sizes of the contact layer 24 and the p-side electrode 36.

Embodiment 3

Figure 8:
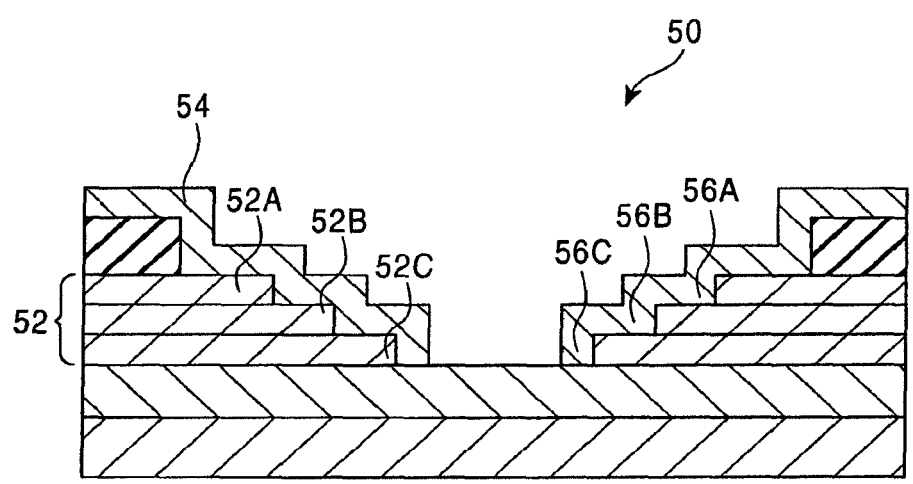
FIG. 8 is a sectional view showing the structure of a surface light emitting semiconductor laser element in according to a third embodiment of the present invention.

FIG. 8 shows a sectional view of an alternative surface light emitting semiconductor laser element according to the present invention.

The alternative surface light emitting semiconductor laser element has a similar structure in a main part 50 to the surface light emitting semiconductor laser element 10 except that a contact layer 52 and a p-side electrode 54 have different structures.

As shown in FIG. 8, the contact layer 52 includes three layer: an upper contact layer 52A, a middle contact layer 52B, and a lower contact layer 52C. The impurity concentrations of respective contact layers gradually decrease stepwise from the upper contact layer to the lower contact layer.

The lower contact layer 52C has, for example, an impurity concentration of $5\times10^{18}$, which is the lowest among the three contact layers, and has an opening 56C which is the largest opening. The middle contact layer 52B has, for example, an impurity concentration of $1\times10^{19}$, which is higher than the lower contact layer, but lower than the upper contact layer, and has an opening 56B which is smaller than the opening 56C of the lower contact layer, but greater than an opening 56A of the upper contact layer. The upper contact layer 52A has, for example, an impurity concentration of $3\times10^{19}$, which is the highest among the three contact layers, and has the opening 56A which is the smallest among the three contact layers.

The p-side electrode 54 is also formed step-wise so as to conform to the contact layers 52A, 52B and 52C, as well as the openings 56A, 56B and 56O.

According to the configuration of the contact layer 52 and the p-side electrode 54, an effective complex refractive index distribution structure is formed to improve focusing of the light, whereby a single-peak transverse mode can be more easily provided.

Figure 9:
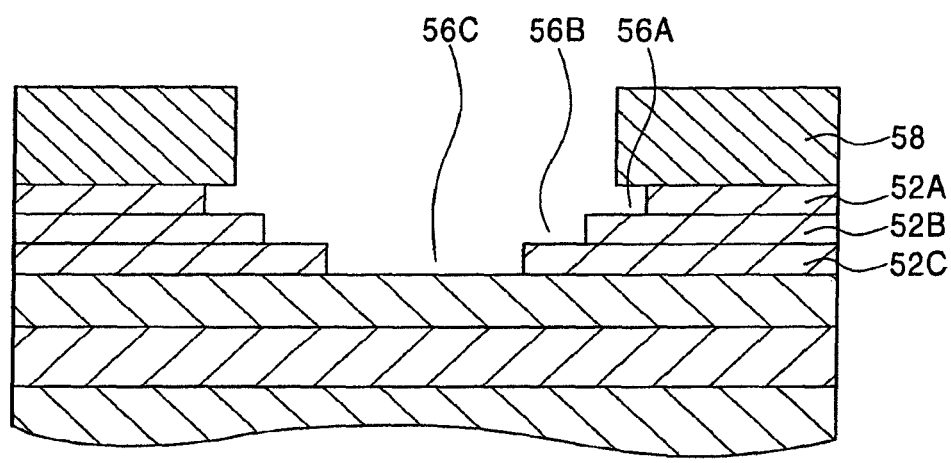
FIG. 9 is a sectional view showing the structure of the surface light emitting semiconductor laser element in according to a third embodiment of the present invention.

As described above, the contact layer 52 is formed such that three layers have respective openings in a step-wise fashion. Specifically, an etching mask 58 is disposed on the upper contact layer 52A having lower impurity concentration, as shown in FIG. 9. The three contact layers 52A, 52B and 52C are dry etched under the same etching conditions. Since the etching rates are different due to the different impurity concentrations, the openings 56A, 56B and 56C having the desired sizes are formed on the three contact layers 52A, 52B and 52C.

Alternatively, the three contact layers may be formed so that the Al compositions decrease step-wise from the upper contact layer to the lower contact layer. The three contact layers 52A, 52B and 52C are dry etched under the same etching conditions. Since the etching rates are different due to the different Al compositions, the openings 56A, 56B and 56C having diameters that become smaller step-wise from the upper contact layer to the lower contact layer are formed on the three contact layers 52A, 52B and 52C.

Embodiment 4

Figure 10A:
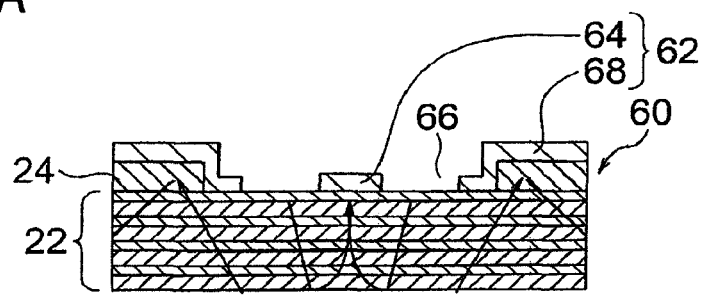
FIG. 10A is a sectional view showing the structure of a surface light emitting semiconductor laser element in according to a fourth embodiment of the present invention.
Figure 10B:
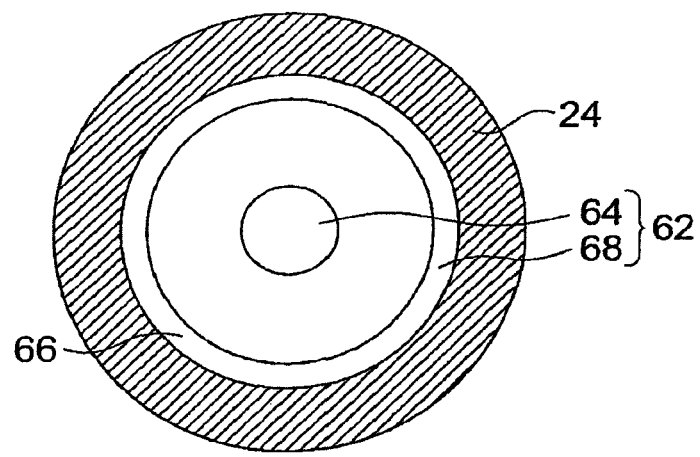
FIG. 10B is a plan view showing the structure of the surface light emitting semiconductor laser element in according to a fourth embodiment of the present invention.
Figure 10C:
FIG. 10C is a waveform of a transverse mode in according to a fourth embodiment of the present invention.

FIGS. 10A and 10B are a sectional view and a plan view respectively showing the structure of a surface light emitting semiconductor laser element oscillating in a higher-order mode according to the present invention. FIG. 10C is a waveform of a transverse mode.

The surface light emitting semiconductor laser element emits light in a $TE_{01}$ mode (donut-like light emission pattern). As shown in FIGS. 10A and 10B, the surface light emitting semiconductor laser element comprises, as a main part 60, a p-side electrode 62 including a circular central electrode 64 and an annular electrode 68 disposed via an annular light emitting window 66, as in EMBODIMENT 1.

The surface light emitting semiconductor laser element has a similar structure to the surface light emitting semiconductor laser element 10 in EMBODIMENT 1 except that the p-side electrode 62 has a different structure.

The contact layer 24 and the p-side electrode 62 provide the same effects as the complex refractive index distribution structure described in the surface light emitting semiconductor laser element 10 oscillating in the single mode. The single basic mode lower than the desired high-order mode is suppressed, and at the same time, modes higher than the desired high-order mode are suppressed.

In this EMBODIMENT, the basic mode is absorbed and suppressed at the circular central electrode 64 made of gold disposed at the center of the light emitting surface. The modes higher than the $TE_{01}$ mode are scattered using the aperture of the current confinement layer 28 (see FIG. 1) and the concave lens of the contact layer 24 in the complex refractive index distribution structure. Thus, light is selectively emitted in the $TE_{01}$ mode.

As long as the constriction diameter of the current confinement layer is set to cut-off the transverse modes other than the $TE_{01}$ mode, the selectivity of the $TE_{01}$ mode is further improved.

As to conventional high-order mode control, Japanese Unexamined Patent Application Publication No. 2002-359432 discloses, for example, a method of selecting a mode by forming a groove (or a convex-concave shape) having a depth of a ½ wavelength or ¼ wavelength on a mesa surface to exclude any undesirable excited modes or to include the desirable modes.

However, although some functions can be added to the mesa using post processing such as ion beam etching, the devices are processed only one-by-one, thus reducing production efficiency, and the groove depth, that is the interference optical path difference, should be precisely defined, even if the device is subjected to patterning etching. Accordingly, such a conventional semiconductor laser may not be applicable to commercial devices.

In contrast, the laser resonance mode can be selected by providing the complex refractive index distribution structure on the uppermost side of the resonator according to the present invention. In addition, the complex refractive index distribution structure can be provided by adjusting the shape or the refractive index of the compound semiconductor layer on the mesa, the insulation film, or the electrode in the typical production processes without adding any steps. Respective parts of the complex refractive index distribution structure can be produced with such a precision that is required for typical surface light emitting semiconductor laser elements. No high precise production processes are required. Currently available general process precision is enough for producing the complex refractive index distribution structure according to the present invention. Therefore, the complex refractive index distribution structure can be produced with good reproducibility.

Comparative Embodiment

Figure 11:
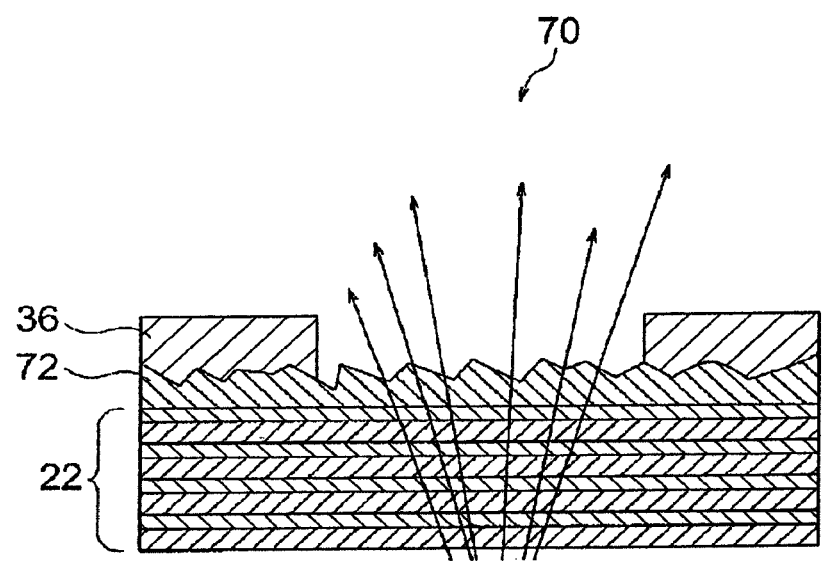
FIG. 11 is a sectional view showing the structure of a surface light emitting semiconductor laser element in a Comparative Example.
Figure 12:
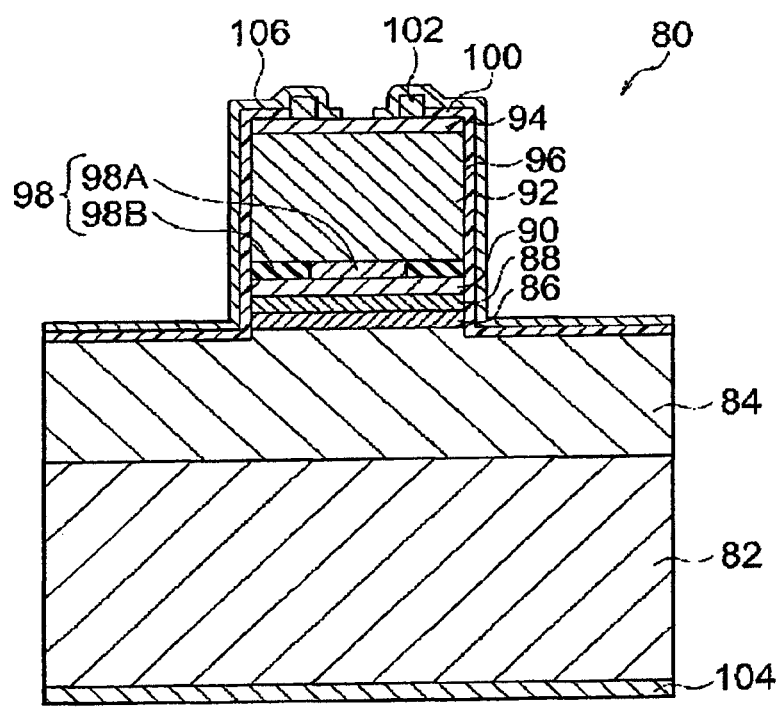
FIG. 12 is a sectional view showing the structure of a conventional surface light emitting semiconductor laser element.
Figure 13A:
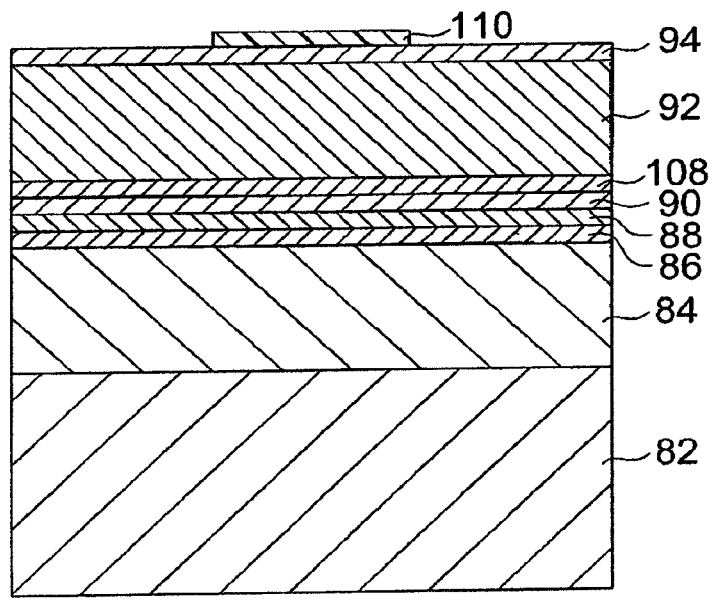
FIG. 13A is a sectional view showing a step of manufacturing the conventional surface light emitting semiconductor laser element.
Figure 13B:
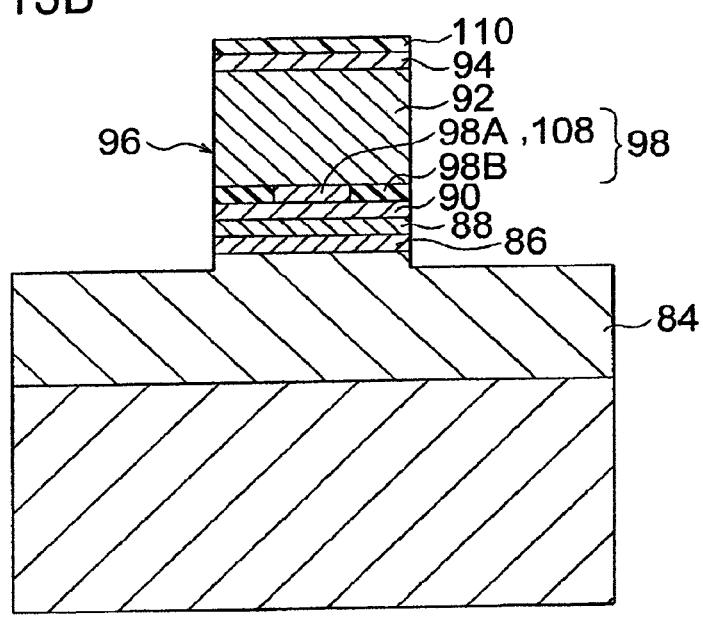
FIG. 13B is a sectional view showing a step of manufacturing the conventional surface light emitting semiconductor laser element.
Figure 14A:
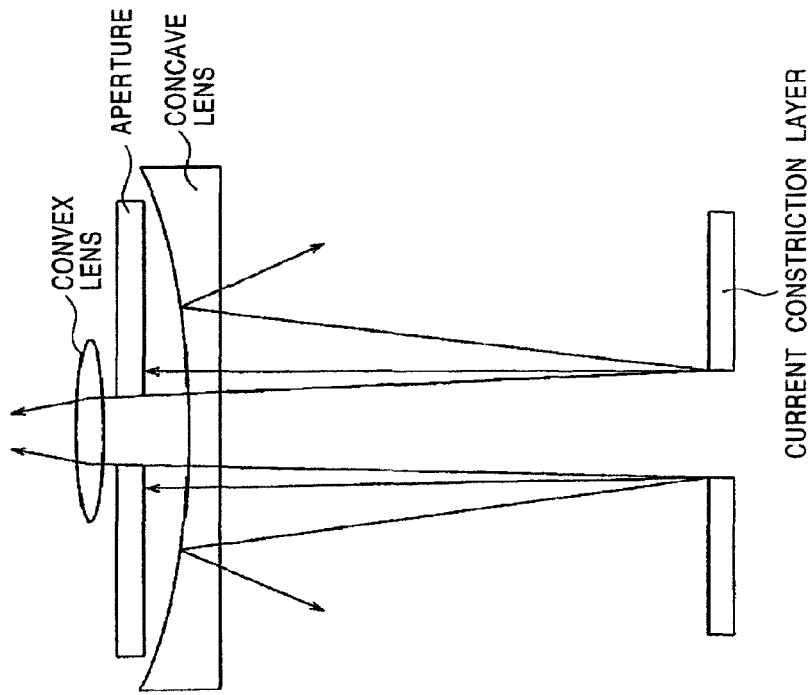
FIG. 14A is a schematic sectional view showing a main part of a surface light emitting semiconductor laser element according to one embodiment of the present invention.
Figure 14B:
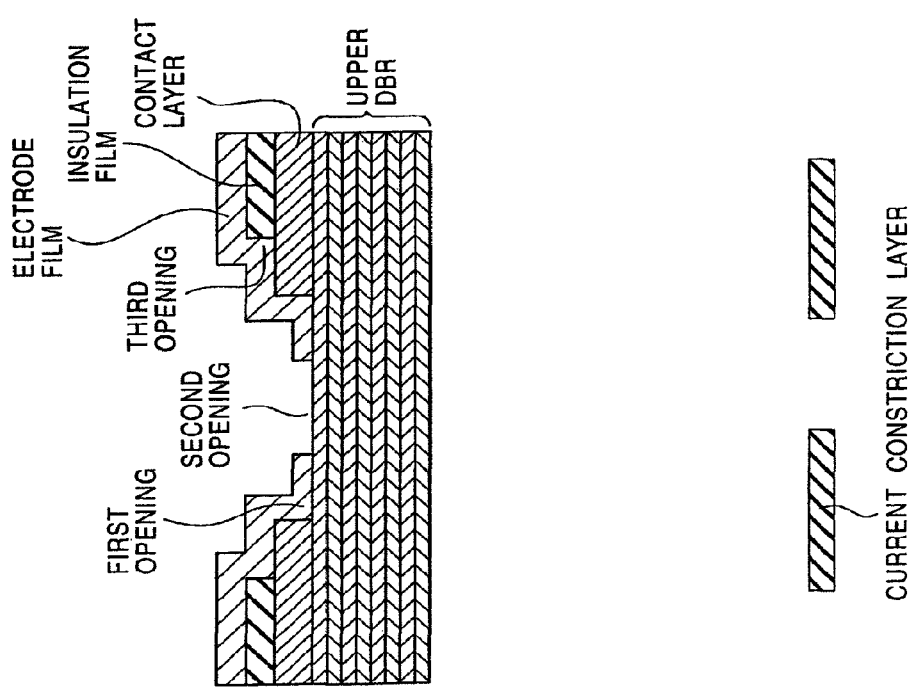
FIG. 14B is a schematic sectional view illustrating a function of the main part shown in FIG. 14A.

FIG. 11 is a sectional view showing the structure of a comparative surface light emitting semiconductor laser element.

The comparative surface light emitting semiconductor laser element comprises, as a main part 70, a scattering structure that randomly scatters light to an upper surface of a mesa, and a contact layer 72 having a fine convex-concave surface.

Scattering at the convex-concave surface of the contact layer 72 affects the oscillation mode. A number of modes oscillate randomly. The light emitted therefrom includes a number of modes, resulting in a random light emission pattern.

What is claimed is:

1. A light-emitting semiconductor laser element comprising:
   a first-type semiconductor layer structure including a lower reflector;
   a current confinement layer including a current injection region and an oxidized region;
   an active layer disposed between the lower reflector and the current confinement layer;
   a second-type semiconductor layer structure including an upper reflector, the upper reflector disposed on the current confinement layer, the second-type semiconductor layer structure including an uppermost layer; and
   a complex refractive index distribution structure having a complex refractive index, the complex refractive index distribution structure comprising
      a first refractive index layer having a first refractive index and disposed on the uppermost layer, the first refractive index layer including a first sidewall surface that defines a boundary, a first upper surface, and a first lower surface, wherein the boundary has a first diameter that gradually decreases in a direction from the first upper surface to the first lower surface; and
      an electrode layer having a second refractive index that is different than the first refractive index and disposed on the first refractive index layer and the uppermost layer, wherein the electrode layer comprises a second sidewall surface and defines an opening having a second diameter, the second diameter taken at any point along the opening being smaller than the first diameter taken at any point along the first sidewall surface,
   wherein the first refractive index layer and the electrode layer constitute the complex refractive index distribution structure, and
   wherein the complex refractive index changes in an outward direction from a center of the opening.

2. The light-emitting semiconductor laser element according to claim 1,
   wherein the first refractive index layer is disposed directly on the uppermost layer, and
   wherein the electrode layer is disposed directly on the uppermost layer and the first refractive index layer.

3. The light-emitting semiconductor laser element according to claim 1, wherein the first lower surface extends parallel to a top surface of the uppermost layer to an edge of the uppermost layer.

4. The light-emitting semiconductor laser element according to claim 1, wherein the electrode layer is a metallic layer surrounding the opening.

5. The light-emitting semiconductor laser element according to claim 4, wherein the first sidewall surface is in direct contact with the metallic layer.

6. The light-emitting semiconductor laser element according to claim 1, wherein the first refractive index is larger than that of the boundary defined by the first sidewall surface.

7. The light-emitting semiconductor laser element according to claim 1, wherein
   the first refractive index is greater than the second refractive index.

8. The light-emitting semiconductor laser element according to claim 1, wherein the first refractive index layer comprises a semiconductor material.

9. The light-emitting semiconductor laser element according to claim 1, further comprising a second electrode disposed within the opening and disposed on the uppermost layer.

10. The light-emitting semiconductor laser element according to claim 9, wherein the second electrode is a metallic layer.

11. The light-emitting semiconductor laser element according to claim 9, wherein the electrode layer has an annular shape and the second electrode has a circular shape.

12. The light-emitting semiconductor laser element according to claim 1, further comprising an insulation layer disposed at least partially on the first refractive index layer.

13. The light-emitting semiconductor laser element according to claim 1, wherein the first refractive index layer has a first annular shape and the electrode layer has a second annular shape.

14. The light-emitting semiconductor laser element according to claim 1, wherein the current injection region has a third diameter that is smaller than the second diameter taken at any point along the opening defined by the electrode layer.

15. A light-emitting module comprising:
   a light-emitting semiconductor laser element; and
   one or more optical elements,
   wherein the light-emitting semiconductor laser element is optically coupled to the one or more optical elements, the light-emitting semiconductor laser element comprising:
      a first-type semiconductor layer structure including a lower reflector;
      a current confinement layer including a current injection region and an oxidized region;
      an active layer disposed between the lower reflector and the current confinement layer;
      a second-type semiconductor layer structure including an upper reflector, the upper reflector disposed on the current confinement layer, the second-type semiconductor layer structure including an uppermost layer; and
      a complex refractive index distribution structure having a complex refractive index comprising
         a first refractive index layer having a first refractive index and disposed on the uppermost layer, the first refractive index layer including a first sidewall surface that defines a boundary, a first upper surface, and a first lower surface, wherein the boundary has a first diameter that gradually decreases in a direction from the first upper surface to the first lower surface; and
         an electrode layer having a second refractive index that is different than the first refractive index and disposed on the first refractive index layer and the uppermost layer, wherein the electrode layer comprises and defines an opening having a second diameter, the second diameter taken at any point along the opening being smaller than the first diameter taken at any point along the first sidewall surface, wherein the first refractive index layer and the electrode layer constitute the complex refractive index distribution structure, and wherein the complex refractive index changes in an outward direction from a center of the opening.

16. The light-emitting module according to claim 15, wherein the first refractive index layer is disposed directly on the uppermost layer, and wherein the electrode layer is disposed directly on the uppermost layer and the first refractive index layer.

17. The light-emitting module according to claim 15, wherein the first lower surface extends parallel to a top surface of the uppermost layer to an edge of the uppermost layer.

18. The light-emitting module according to claim 15, wherein the one or more optical elements includes one or more optical waveguides.

19. The light-emitting module according to claim 15, wherein the electrode layer is a metallic layer surrounding the opening.

20. The light-emitting module according to claim 19, wherein the first sidewall surface is in direct contact with the metallic layer.

21. The light-emitting module according to claim 15, wherein the first refractive index is larger than that of the boundary defined by the first sidewall surface.

22. The light-emitting module according to claim 15, wherein the first refractive index being greater than the second refractive index.

23. The light-emitting module according to claim 15, wherein the first refractive index layer comprises a semiconductor material.

24. The light-emitting module according to claim 15, further comprising a second electrode disposed within the opening and disposed on the uppermost layer.

25. The light-emitting module according to claim 24, wherein the electrode layer has an annular shape and the second electrode has a circular shape.

26. The light-emitting module according to claim 15, further comprising an insulation layer disposed at least partially on the first refractive index layer.

27. The light-emitting module according to claim 15, wherein the first refractive index layer has a first annular shape and the electrode layer has a second annular shape.

28. The light-emitting module according to claim 15, wherein the current injection region has a third diameter that is smaller than the second diameter taken at any point along the opening defined by the electrode layer.

* * * * *